(12) United States Patent
Taguchi

(10) Patent No.: US 9,136,208 B2
(45) Date of Patent: Sep. 15, 2015

(54) SEMICONDUCTOR DEVICE AND METHOD OF MANUFACTURING THE SAME

(71) Applicant: SEIKO INSTRUMENTS INC., Chiba-shi, Chiba (JP)

(72) Inventor: Yasuhiro Taguchi, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 14/499,802

(22) Filed: Sep. 29, 2014

(65) Prior Publication Data
US 2015/0091144 A1    Apr. 2, 2015

(30) Foreign Application Priority Data

Oct. 1, 2013    (JP) .................................. 2013-206652

(51) Int. Cl.
| | | |
|---|---|---|
| *H01L 23/495* | (2006.01) | |
| *H01L 23/31* | (2006.01) | |
| *H01L 21/48* | (2006.01) | |
| *H01L 21/56* | (2006.01) | |

(52) U.S. Cl.
CPC ...... *H01L 23/49517* (2013.01); *H01L 21/4825* (2013.01); *H01L 21/56* (2013.01); *H01L 23/3114* (2013.01)

(58) Field of Classification Search
CPC ..................... H01L 23/49517; H01L 23/3114; H01L 21/4825; H01L 21/56

USPC ............................... 27/666; 257/666; 438/123
See application file for complete search history.

(56) References Cited

U.S. PATENT DOCUMENTS

| | | | | |
|---|---|---|---|---|
| 4,862,246 A | * | 8/1989 | Masuda et al. ................ | 257/666 |
| 4,920,074 A | * | 4/1990 | Shimizu et al. ................ | 29/827 |
| 5,391,439 A | * | 2/1995 | Tomita et al. ................. | 428/571 |
| 6,608,366 B1 | * | 8/2003 | Fogelson et al. .............. | 257/666 |

OTHER PUBLICATIONS

Patent Abstracts of Japan, Publication No. 07-045769, Publication Date Feb. 14, 1995.
Patent Abstracts of Japan, Publication No. 2006-019465, Publication Date Jan. 19, 2006.

\* cited by examiner

*Primary Examiner* — Roy Potter
(74) *Attorney, Agent, or Firm* — Adams & Wilks

(57) ABSTRACT

A semiconductor device has an encapsulating resin for covering a semiconductor chip and an outer lead extending from a side surface of the encapsulating resin. An inclined portion is formed in a bottom surface of the outer lead. A through recessed portion is formed in an end surface of the outer lead so as to vertically pass through the outer lead from an upper surface of the outer lead to the inclined portion. A thick plated layer covers the inclined portion and an inner surface of the through recessed portion. A thin plated layer covers the end surface of the outer lead.

12 Claims, 8 Drawing Sheets

SEMICONDUCTOR DEVICE AND METHOD OF MANUFACTURING THE SAME

BACKGROUND OF THE INVENTION

1. Field of the Invention

The present invention relates to a semiconductor device using a lead frame and a method of manufacturing the same.

2. Description of the Related Art

A portable electronic device has been downsized in recent years, and a semiconductor package to be used therein has accordingly been required to be downsized and thinned while securing a mounting strength. Employing a surface mount package has been known as a measure for downsizing the semiconductor package, in which an external terminal protrudes in parallel to a substrate mounting surface. Examples of this package type include a small outline non-lead package (SON) and a quad flat non-lead package (QFN). Those packages have a feature in that an external electrode for mounting the package on a substrate is smaller than that of a dual inline package (DIP) or a small outline package (SOP) that has been used in the related art, and hence a solder fillet is hardly formed after the package is mounted on the substrate, and it is difficult to obtain a sufficient mounting strength. Note that, those packages are often manufactured with use of a lead frame produced by using a stamping mold or processing of etching. As a material of the lead frame, a 194 alloy or a copper alloy is used in general.

In manufacturing of the semiconductor device using the lead frame, a semiconductor chip is mounted on the lead frame, and the semiconductor chip and the lead frame are electrically connected to each other via wires. The resultant structure is then subjected to resin encapsulation processing and burr processing, and exterior plating processing is carried out on the copper surface. After the exterior plating processing, the semiconductor device is cut off from the lead frame so as to have a predetermined size. As described above, the semiconductor device is cut off from the lead frame after the exterior plating processing, and hence no exterior plated film is formed on the cut surface of the external electrode. Accordingly there is a problem in that the solder wettability is poor when the semiconductor device is mounted on the substrate. In view of this, in order to improve the mounting strength of the semiconductor package produced under such conditions, it is proposed that the shape of a lead distal end portion be changed in plan view or cross-sectional view so that the solder wettability after the semiconductor device is mounted on the substrate is improved and a solder fillet is thus easily formed, to thereby increase the mounting strength (for example, see Japanese Patent Application Laid-open Nos. 2006-19465 and Hei 7-45769).

However, along with the progress in downsizing and thinning of a semiconductor device, it is required to further improve the substrate mounting strength of the semiconductor device.

SUMMARY OF THE INVENTION

The present invention provides a semiconductor device using a surface mount package, which can have a further increased solder bonding strength to a substrate, and a method of manufacturing the semiconductor device.

In order to solve the problem described above, the following measures are taken.

First, according to one embodiment of the present invention, there is provided a semiconductor device, including: an encapsulating resin for covering a semiconductor chip; and an outer lead extending from a side surface of the encapsulating resin. The extending outer lead has a bottom surface including an inclined portion, and a distal end of the outer lead in the extending direction has an end surface and a through recessed portion vertically passing through the outer lead. The inclined portion and an inner surface of the through hole are covered with a thick plated layer, and the end surface is covered with a thin plated layer.

Further, in the semiconductor device, the through recessed portion includes an opening edge having a tapered shape.

Further, in the semiconductor device, the outer lead includes a plurality of the through recessed portions formed therein.

Further, the semiconductor device further includes a solder layer formed on the inner surface of the through recessed portion and the inclined portion, the solder layer being thicker than a solder layer formed on a side surface of the outer lead.

Further, according to one embodiment of the present invention, there is provided a method of manufacturing a semiconductor device including an encapsulating resin for covering a semiconductor chip, and an outer lead extending from a side surface of the encapsulating resin, the method including: forming a through hole in the outer lead; forming exterior plating on the outer lead; forming an inclined portion in a lower surface of the through hole; and cutting the outer lead so as to cross the through hole, in which the outer lead is cut so as to cross the through hole at a position apart from a center of the through hole.

Further, in the method of manufacturing a semiconductor device, the forming an inclined portion includes using a notching punch including a protruding portion of a right triangular shape.

According to one embodiment of the present invention, when the semiconductor device is mounted on the substrate, the outer lead includes the distal end and the lower surface that have the region for forming the thick solder layer, and hence the semiconductor device can be firmly bonded to the substrate.

DETAILED DESCRIPTION OF THE PREFERRED EMBODIMENTS

Now, the present invention is described with reference to the drawings.

Figure 1:
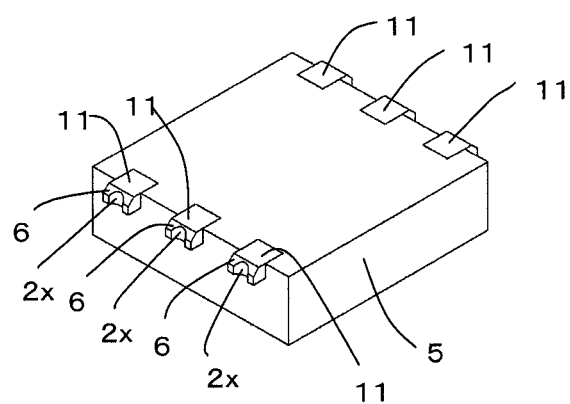
FIG. 1 is a bird's-eye view illustrating a semiconductor device according to a first embodiment of the present invention (with an outer lead illustrated on the upper side).

FIG. 1 is a bird's-eye view illustrating a semiconductor device according to a first embodiment of the present invention. In this case, outer leads 11 that extend from an encapsulating resin 5 to be exposed are illustrated on the upper side. A through recessed portion 2x is formed in the end surface of the outer lead 11, namely, the distal end of the outer lead, and an inclined portion 6 is formed on the bottom surface of the outer lead 11 close to the distal end. Note that, the encapsulating resin 5 encapsulates components other than the outer lead.

Figure 2:
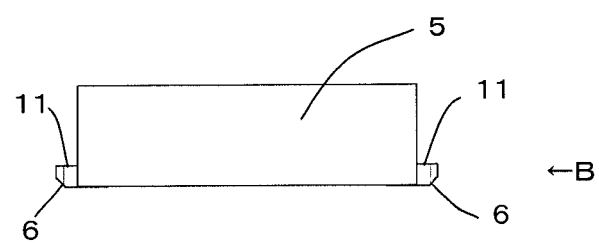
FIG. 2 is a side view illustrating the semiconductor device according to the first embodiment of the present invention (with the outer lead illustrated on the lower side).

FIG. 2 is a side view illustrating the semiconductor device according to the first embodiment of the present invention. In this case, the outer leads 11 that extend from the encapsulating resin 5 are illustrated on the lower side, and a mounting surface for mounting the semiconductor device on a substrate corresponds to the lower surface of FIG. 2. The outer leads 11 include the lower surfaces exposed from the encapsulating resin 5, and the bottom surfaces formed into substantially the same shape. In addition, apart of the bottom surface of the outer lead 11, which is exposed from the side surface of the encapsulating resin 5 and is close to the distal end, corresponds to the inclined portion 6.

Figure 3A:
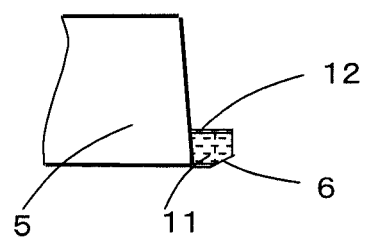
FIGS. 3A and 3B are enlarged side views illustrating the outer lead of FIG. 2 and the vicinity thereof.
Figure 3B:
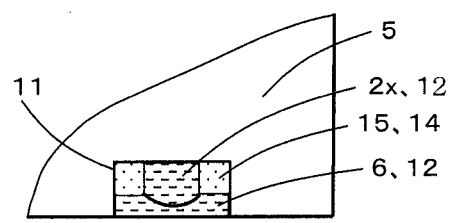

FIGS. 3A and 3B are enlarged side views illustrating the outer lead of FIG. 2 and the vicinity thereof. FIG. 3A is an enlarged view of the outer lead and the vicinity thereof when viewed from the same direction as in FIG. 2. The surfaces (upper surface, side surface, bottom surface) of the outer lead 11 are covered with a plated film 12. Further, the inclined portion 6 formed on the bottom surface of the lead is covered with the plated film 12 as well. This plated film is formed for improving the solder wettability when the semiconductor device is solder mounted. FIG. 3B illustrates the outer lead and the vicinity thereof when viewed from the direction B of FIG. 2. When viewed from the direction B, the through recessed portion 2x, which vertically passes through the outer lead 11 from the upper surface to the inclined portion, is formed in the rectangular end surface of the outer lead 11, the bottom surface of the outer lead 11 corresponds to the inclined portion 6, and the inner wall of the through recessed portion 2x and the inclined portion 6 are covered with the thick plated film 12. Both sides of the end surface of the through recessed portion 2x correspond to cut surfaces 15 formed when the lead is cut, and a thin plated layer 14 is partially formed thereon. The thin plated layer 14 is a plated layer that creeps up from the lower side when the lead is cut.

Next, a method of manufacturing a semiconductor device according to the present invention is described.

FIGS. 4A to 4D are plan views illustrating a method of manufacturing the semiconductor device according to the first embodiment of the present invention.

Figure 4A:
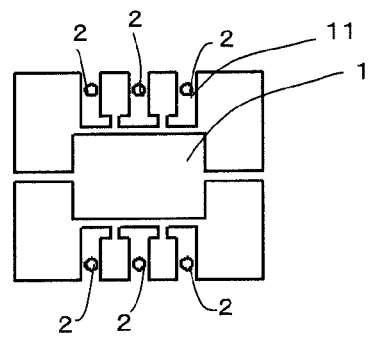
FIGS. 4A to 4D are plan views illustrating a method of manufacturing the semiconductor device according to the first embodiment of the present invention.
Figure 4B:
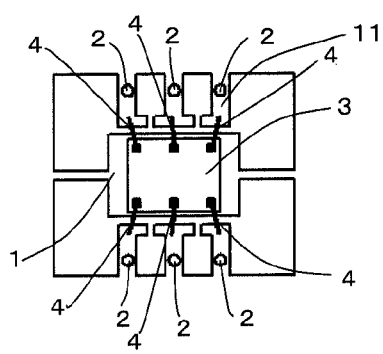
Figure 4C:
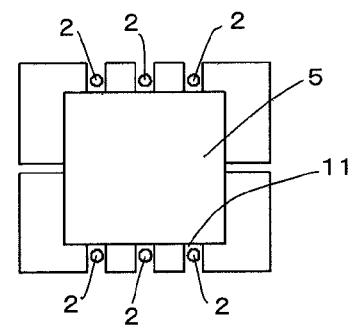
Figure 4D:
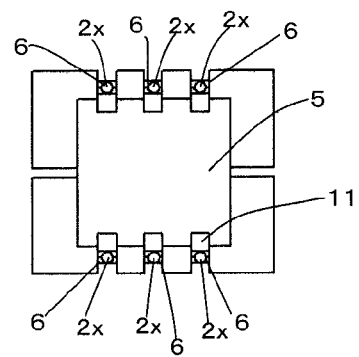

FIG. 4A is a plan view schematically illustrating the lead frame according to this embodiment. FIG. 4A illustrates an island 1 for mounting a semiconductor chip thereon, the outer leads 11 formed around the island 1, and through holes 2 vertically passing through the respective outer leads. Note that, the outer lead refers to a part of the lead exposed from the encapsulating resin in general, but herein refers to the entire lead. In FIG. 4A, the through hole 2 is a circle in plan view. However, the through hole 2 is not limited to the circle and may be an ellipse or a polygon. FIG. 4B is a view illustrating a state in which a semiconductor chip 3 is die-bonded on the island 1, and electrodes of the semiconductor chip 3 and the leads are connected to each other via wires 4. FIG. 4C is a top view illustrating a state in which the island 1, the semiconductor chip 3, the wires 4, and a part of the leads are encapsulated by the encapsulating resin 5. The outer lead 11 and the through hole 2 are exposed from the encapsulating resin 5. At this time, the surface of the lead frame is covered with copper or copper oxide, and exterior plating is thereafter formed on the surface in order to improve the solder wettability when the semiconductor device is mounted on the substrate. FIG. 4D is a rear view illustrating a state in which notch shapes 6 across the respective through holes 2 are formed in the outer leads 11 after the exterior plating processing. Because the through recessed portion 2x and the inclined portion 6 are formed, the cross-sectional area of the cut surface along the notch shape 6 is about one-third of the cross-sectional area of the same type of outer lead in the related art. Thus, the cutting stress to be applied on the outer lead and the encapsulating resin 5 can be significantly reduced, to thereby reduce the peeling occurring at the bonding interface between the outer lead and the encapsulating resin.

FIGS. 5A to 5E are cross-sectional views illustrating the method of manufacturing the semiconductor device according to the first embodiment of the present invention.

Figure 5A:
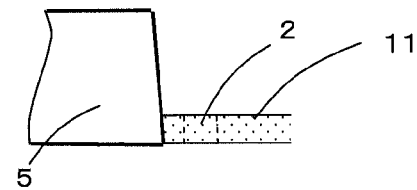
FIGS. 5A to 5E are cross-sectional views illustrating the method of manufacturing the semiconductor device according to the first embodiment of the present invention.

FIG. 5A corresponding to FIG. 4C is a cross-sectional view illustrating the state in which the island, the semiconductor chip, the wires, and a part of the leads are encapsulated by the encapsulating resin 5. The outer lead 11 including the through hole 2 vertically passing therethrough is exposed from the encapsulating resin 5. At this time, the surface of the lead frame is covered with copper or copper oxide.

Figure 5B:
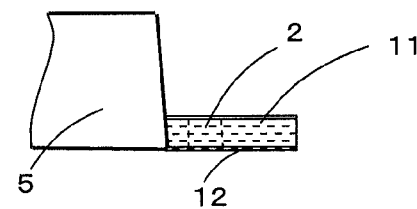

FIG. 5B is a view illustrating a state in which exterior plating is formed on the outer lead 11. Not only the upper surface, lower surface, and side surface of the outer lead 11, but also the inside of the through hole 2 is covered with the plated film.

Figure 5C:
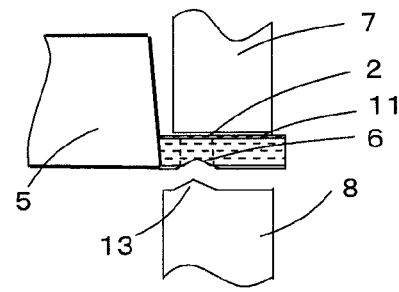

FIG. 5C is a view illustrating a state in which the processing of forming the notch shape in the outer lead 11 is being performed. A V-notching die 7 presses down the upper surface of the outer lead 11, and a V-notching punch 8 presses the outer lead so that a protruding portion 13 of the V-notching punch is brought into abutment against the vicinity of the center of the lower surface of the through hole 2. In this way, the inclined portion 6 having the notch shape is formed in the lower surface of the outer lead 11. The protruding portion of the V notch shape presses the outer lead in this embodiment, but any protruding portion may be employed as long as an inclined portion can be formed in the outer lead at least at a position closer to the encapsulating resin 5.

Figure 5D:
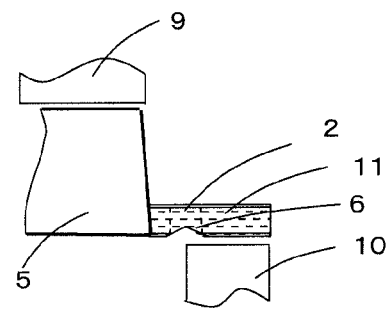
Figure 5E:
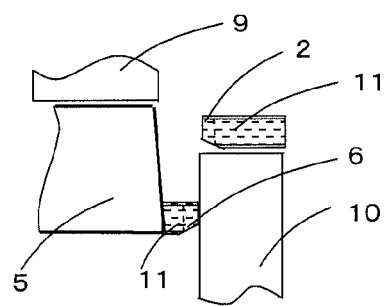

FIG. 5D and FIG. 5E are views illustrating a step of cutting the outer lead 11 so as to cross the through hole 2. The upper portion of the encapsulating resin 5 is fixed by a singulating die 9 and a singulating punch 10 upwardly moves from the lower surface of the outer lead 11, to thereby cut the outer lead 11. In this step, the plated layer covering the inclined portion 6 of the outer lead 11 expands and adheres again to the cut surface along with the movement of the singulating punch 10. In general, when a lead frame is cut off so as to leave leads in a small and thin semiconductor device, the leads are often fixed by clamping the upper surface of the lead in order to prevent an encapsulating resin from breaking down, which is caused by the stress transmitted to the lead portion at the time of cutting. In recent years, however, the semiconductor device has been downsized and the remaining amount of the lead is equal to or less than 0.2 mm, which makes it difficult to clamp the lead. However, in the cutting step according to this embodiment, the cross-sectional area at the time of cutting is about one-third of the cross-sectional area in the related art, and hence the cutting stress to be applied on the outer lead and the encapsulating resin 5 can be significantly reduced, to thereby reduce the peeling occurring at the bonding interface between the outer lead and the encapsulating resin.

Figure 6:
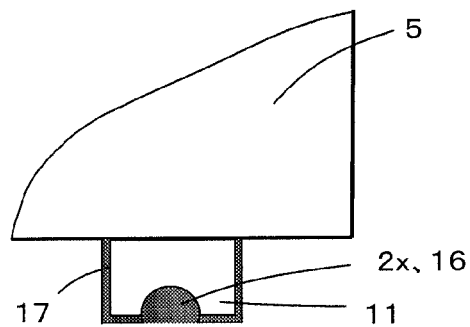
FIG. 6 is a top view illustrating the semiconductor device according to the first embodiment of the present invention, to which solder is applied.

FIG. 6 is a top view illustrating the semiconductor device according to the first embodiment of the present invention, to which solder is applied. A thin solder layer 17 is formed around the outer lead 11, and a thick solder layer 16 is held in the through recessed portion 2x formed in the distal end of the outer lead. No solder layer is illustrated in FIGS. 3A and 3B, but the thick solder layer 16 is also formed under the inclined portion 6. A large amount of solder is supplied via this portion into the through recessed portion 2x, to thereby form the thick solder layer 16 in the through recessed portion 2x. The semiconductor device can thus be firmly connected to the substrate by employing the outer lead shape according to the present invention even when the outer lead 11 is short and has the small contact area to the substrate.

Figure 7:
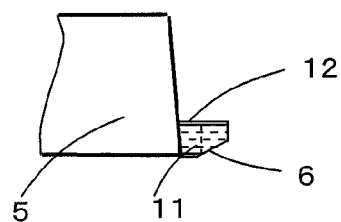
FIG. 7 is a cross-sectional view illustrating a semiconductor device according to a second embodiment of the present invention.

FIG. 7 is a cross-sectional view illustrating a semiconductor device according to a second embodiment of the present invention.

The outer lead 11 is longer and the inclined portion 6 is also longer as compared to those of the first embodiment illustrated in FIG. 3A. This shape is obtained by elongating the inclined portion 6 without changing the position of the through recessed portion of the outer lead 11. This processing can be easily performed by changing the notch shape and a notch forming position as described later.

Figure 8:
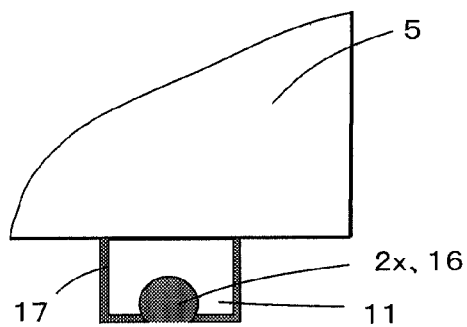
FIG. 8 is a top view illustrating the semiconductor device according to the second embodiment of the present invention, to which solder is applied.

FIG. 8 is a top view illustrating the semiconductor device according to the second embodiment of the present invention, to which solder is applied. Since the distal end of the outer lead 11 crosses the through hole 2 not at the center but at the slightly outer side of the center, the through hole 2 in plan view has a shape in which a portion less than half of a circle is removed, and a portion equal to or more than half thereof is left. This shape enables the solder to be successfully held in the through recessed portion 2x, and hence the semiconductor device can be further firmly connected to the substrate.

Figure 9A:
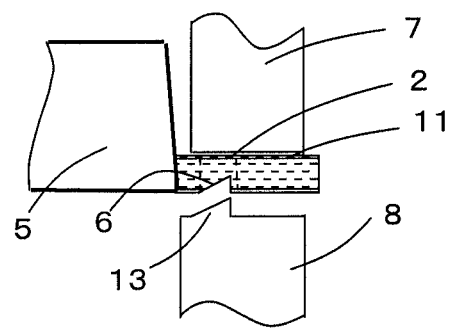
FIGS. 9A and 9B are cross-sectional views illustrating a method of manufacturing the semiconductor device according to the second embodiment of the present invention.
Figure 9B:
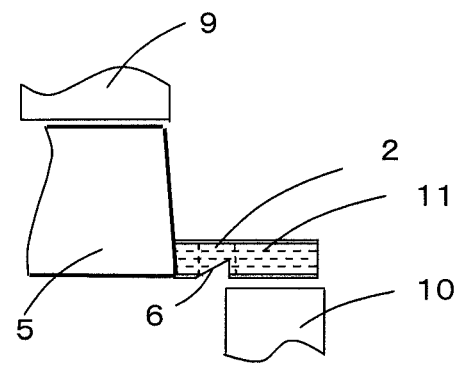

FIGS. 9A and 9B are cross-sectional views illustrating a method of manufacturing the semiconductor device according to the second embodiment of the present invention.

The method of manufacturing the semiconductor device according to the second embodiment involves performing the processing of steps of FIG. 5A and FIG. 5B, and the processing of steps of FIG. 9A and FIG. 9B thereafter. Thus, a detailed description of the processing of steps of FIG. 5A and FIG. 5B is omitted, and only the processing of steps of FIG. 9A and FIG. 9B is now described.

FIG. 9A is a view illustrating a state in which the processing of forming the notch shape in the outer lead 11 is being performed. The V-notching die 7 presses down the upper surface of the outer lead 11, and the V-notching punch 8 presses the outer lead 11 so that the protruding portion 13, which has a right triangular shape having one side vertically extending upward, is brought into abutment against the lower surface of the through hole 2. The outer lead 11 is processed so that the distal end of the protruding portion 13 is brought into abutment against the through hole 2 not at the center but at the outer side of the center. As a result, the notch shape including the inclined portion 6 and the vertical portion is formed in the lower surface of the outer lead 11.

FIG. 9B is a view illustrating a step of cutting the outer lead 11 so as to cross the through hole 2. FIG. 9B differs from FIG. 5D in that the outer lead 11 is cut at the slightly outer side of the center of the through hole 2. The cut surface in this case is formed closer to the encapsulating resin 5 in some degree than the vertical portion formed in the processing of forming the notch shape described above, and farther from the center of the through hole 2. With the detailed definition, the cut surface is formed between the center of the through hole 2 and the edge portion of the through hole that is formed on the outer side of the center. In this step, the plated layer covering the inclined portion 6 of the outer lead 11 expands and adheres again to the cut surface along with the movement of the singulating punch 10. In general, when a lead frame is cut off so as to leave leads in a small and thin semiconductor device, the leads are often fixed by clamping the upper surface of the lead in order to prevent an encapsulating resin from breaking down, which is caused by the stress transmitted to the lead portion at the time of cutting. In recent years, however, the semiconductor device has been downsized and the remaining amount of the lead is equal to or less than 0.2 mm, which makes it difficult to clamp the lead. However, in this cutting step, the cross-sectional area at the time of cutting is about one-third of the cross-sectional area in the related art, and hence the cutting stress to be applied on the outer lead and the encapsulating resin 5 can be significantly reduced, to thereby reduce the peeling occurring at the bonding interface between the outer lead and the encapsulating resin.

Figure 10A:
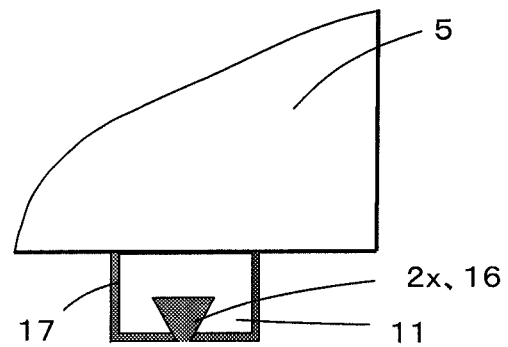
FIGS. 10A to 10C are top views illustrating a modified example of the semiconductor device according to the second embodiment of the present invention, to which solder is applied.
Figure 10B:
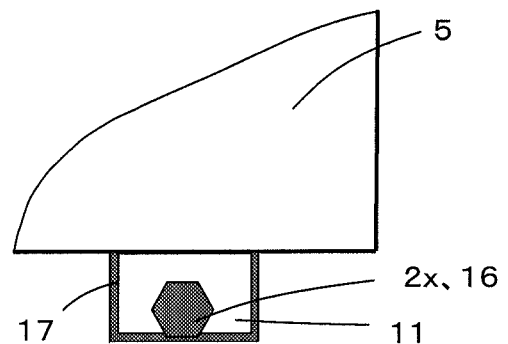
Figure 10C:
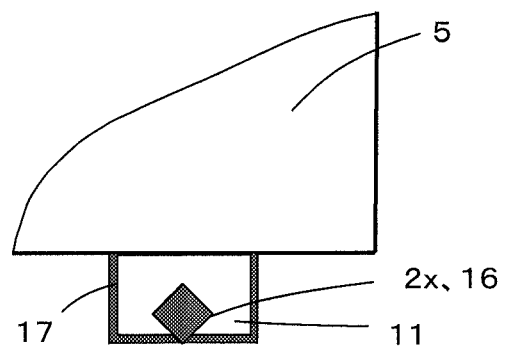

FIGS. 10A to 10C are top views illustrating a modified example of the semiconductor device according to the second embodiment of the present invention, to which solder is applied. FIG. 10A illustrates the through recessed portion 2x having a trapezoidal shape that is obtained by removing a part of a triangular shape. The trapezoidal shape has two sides parallel to each other, specifically, a longer side formed in the through recessed portion and a shorter side corresponding to the distal end of the outer lead. FIG. 10B illustrates the through recessed portion 2x having a shape in which a part of a hexagonal shape is removed. The opening width of the recessed portion formed in the distal end of the outer lead 11 is smaller than the diagonal line of the hexagonal shape. FIG. 10C illustrates the through recessed portion 2x having a shape in which the corner of a rectangular shape is removed. Also in this case, the opening width of the recessed portion formed in the distal end of the outer lead 11 is smaller than the diagonal line of the rectangular shape.

As described above, on the end surface of the outer lead, each of those through recessed portions has the opening width smaller than the maximum length in the recessed portion, in other words, is tapered. Thus, the solder is successfully held in the through holes.

Figure 11A:
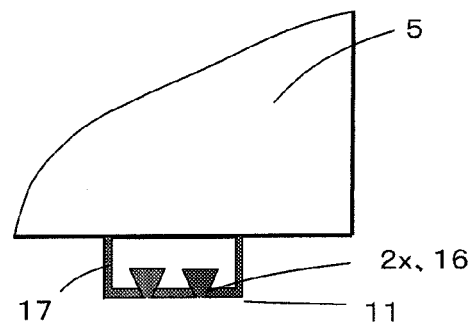
FIGS. 11A to 11C are top views illustrating a semiconductor device according to a third embodiment of the present invention, to which solder is applied.
Figure 11B:
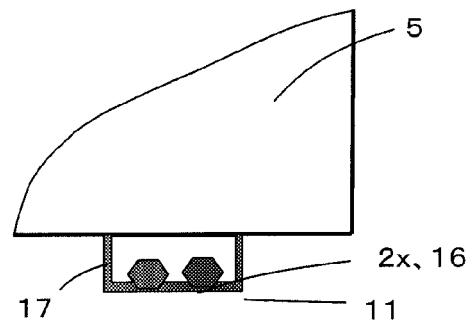
Figure 11C:
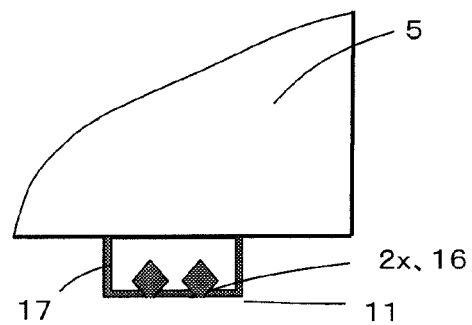

FIGS. 11A to 11C are top views illustrating a semiconductor device according to a third embodiment of the present invention, to which solder is applied. FIGS. 11A to 11C differ from FIG. 8 illustrating the second embodiment in that a plurality of the through recessed portions 2x are formed in a single outer lead 11. As the through recessed portion 2x, FIG. 11A illustrates two triangular shapes arranged side by side, FIG. 11B illustrates two hexagonal shapes arranged side by side, and FIG. 11C illustrates two rectangular shapes arranged side by side. With this configuration, the length of the outer lead can be shortened to realize a further smaller semiconductor device.

What is claimed is:

1. A semiconductor device, comprising:
   an encapsulating resin for covering a semiconductor chip;
   an outer lead extending from a side surface of the encapsulating resin;
   an inclined portion formed in a bottom surface of the extending outer lead;
   a through recessed portion formed in an end surface of the outer lead, the end surface corresponding to a distal end of the outer lead, and the through recessed portion vertically passing through the outer lead from an upper surface of the outer lead to the inclined portion;
   a thick plated layer for covering the inclined portion and an inner surface of the through recessed portion; and
   a thin plated layer for covering the end surface of the outer lead.

2. A semiconductor device according to claim 1, wherein the through recessed portion comprises an opening edge having a tapered shape.

3. A semiconductor device according to claim 1, wherein the outer lead comprises a plurality of the through recessed portions formed therein.

4. A semiconductor device according to claim 1, further comprising a solder layer formed on the inner surface of the through recessed portion and the inclined portion, the solder layer being thicker than a solder layer formed on a side surface of the outer lead.

5. A method of manufacturing a semiconductor device comprising an encapsulating resin for covering a semiconductor chip, and an outer lead extending from a side surface of the encapsulating resin, the method comprising:
   forming a through hole in the outer lead;
   forming exterior plating on the outer lead after the through hole is formed;
   forming an inclined portion in a lower surface of the through hole after the exterior plating is formed; and
   forming a through recessed portion in a distal end of the outer lead at the same time when the outer lead is cut so as to cross the through hole after the inclined portion is formed and so as to vertical pass through the outer lead from an upper surface of the outer lead to the inclined portion.

6. A method of manufacturing a semiconductor device according to claim 5, wherein the outer lead is cut so as to cross the through hole at a position apart from a center of the through hole.

7. A method of manufacturing a semiconductor device according to claim 6, wherein the forming an inclined portion comprises using a notching punch including a protruding portion of a right triangular shape having one side vertically extending upward.

8. A semiconductor device according to claim 1, wherein the through recessed portion has a bottom portion on the inclined portion.

9. A method of manufacturing a semiconductor device according to claim 5, wherein the through recessed portion is formed so that a bottom portion of the through recessed portion is on the inclined portion.

10. A semiconductor device, comprising:
    an encapsulating resin for covering a semiconductor chip; and
    a plurality of outer leads extending from a side surface of the encapsulating resin, each of the outer leads comprising:
      a through recessed portion formed in an end surface of the outer lead;
      an inclined portion formed in a bottom surface of the outer lead so that a bottom portion of the through recessed portion is on the inclined portion;
      a thick plated layer covering the inclined portion and an inner surface of the through recessed portion; and
      a thin plated layer covering the end surface of the outer lead.

11. A semiconductor device according to claim 10, wherein for each of the outer leads, the through recessed portion comprises an opening edge having a tapered shape.

12. A semiconductor device according to claim 10, wherein each of the outer leads further comprises a solder layer formed on a side surface of the outer lead and having a first thickness, and a solder layer formed on the inner surface of the through recessed portion and the inclined portion and having a second thickness greater than the first thickness.

* * * * *